United States Patent [19]

Ogawa et al.

[11] Patent Number: 4,869,835

[45] Date of Patent: Sep. 26, 1989

[54] ION SOURCE

[75] Inventors: Soichi Ogawa, Kobe; Akio Okamoto, Osaka; Shigeo Fukui, Kyoto; Tsutomu Ueno, Hirakata, all of Japan

[73] Assignees: Osaka Prefecture; Cryovac Corporation, both of Osaka, Japan

[21] Appl. No.: 272,969

[22] Filed: Nov. 18, 1988

[30] Foreign Application Priority Data

Nov. 20, 1987 [JP] Japan .............................. 62-294830

[51] Int. Cl.$^4$ .......................................... H01J 27/02
[52] U.S. Cl. ................................. 250/423 R; 250/427; 315/111.81
[58] Field of Search .......................... 250/423 R, 427; 313/359.1, 360.1, 362.1, 363.1; 315/111.31, 111.41, 111.61, 111.81; 219/121.48, 121.52

[56] References Cited

U.S. PATENT DOCUMENTS 2,945,951  7/1960  Bright ................................. 250/427
4,549,082 10/1985  McMillan ........................... 250/427

Primary Examiner—Jack I. Berman
Attorney, Agent, or Firm—Armstrong, Nikaido, Marmelstein, Kubovcik & Murray

[57] ABSTRACT

The present invention provides an ion source comprising an ion-generating chamber and an anode formed of multi-capillary for sending high-density atoms or molecules to be ionized into the ion-generating chamber in a constant direction.

4 Claims, 2 Drawing Sheets

ION SOURCE

BACKGROUND OF THE INVENTION

The present invention relates to an ion source used for deposition of a functional thin-film by the method such as PVD, etc. and more particularly to an ion-generating apparatus for generating ions with a relatively high current density of 1 mA/cm$^2$ or more even under high vacuum of $10^{-4}$ Torr or less using energy as low as 200 V or less required for irradiating a substrate with ions to form a thin-film.

Thin-film of high-quality compound or metal is synthesized by irradiating a substrate with ion beam of an active gas such as nitrogen, oxygen and hydrogen and the features of thin-film are improved by irradiating the film with ion beam of an inert gas such as He, Ne, Ar and Kr. Since the existing ion source used for such a purpose requires energy of several hundred to several thousand eV and the ion current density obtained is 100 µA/cm$^2$ or less, it is unfit for the purpose. (See P. 68 of "Semiconductor Plasma Process Technology" by T. Sugano, published by Sangyo Tosho (1980)). A low-energy ion source with a single Kauffmann grid has been proposed recently. The accelerating voltage thereof is 50 to 130 V and the ion current density calculated in terms of the value in the vicinity of grid is only 0.97 mA/cm$^2$ even under the optimum conditions. This ion source cannot be therefore considered a great improvement. (See pp. 10–15, Vol. 29, No. 11 (1986), "Vacuum" by K. Usami et al).

SUMMARY OF THE INVENTION

The present inventors found from the investigation made considering the state of art as mentioned above that ions with an ion current density as high as 1 mA/cm$^2$ or more can be generated by discharging the filament emitting thermal electrons while sending high-intensity atomic or molecular beam which has a direction through a bundle of multi-capillaries with an aspect ratio of about 100 to about 1000 into an ion-generating chamber kept under vacuum as high as $10^{-4}$ Torr or less.

The present invention provides an ion-generating apparatus comprising an ion-generating chamber and an anode comprising a bundle of multi-capillaries to supply high-density atoms or molecules to be ionized uniformly passing in a direction into the ion-generating chamber.

The present invention will be described in more detail referring to the drawings.

DETAILED DESCRIPTION OF THE INVENTION

Figure 1:
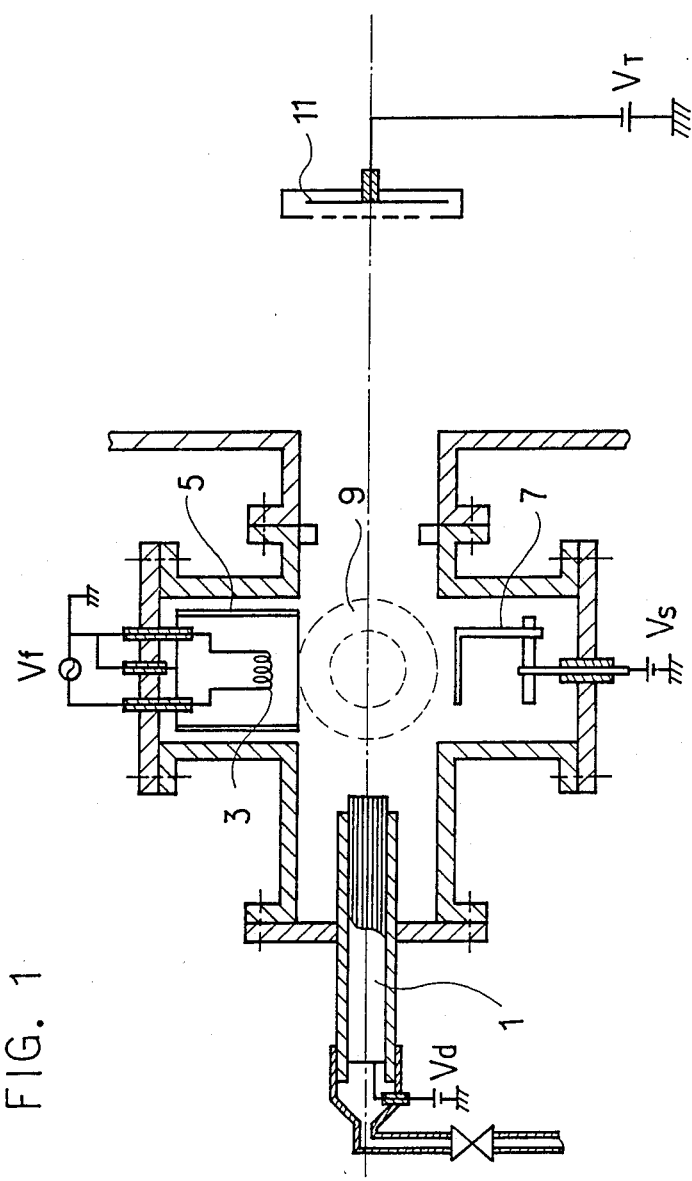
FIG. 1 is a schematic diagram of an ion source in accordance with the invention.

As illustrated in FIG. 1, an ion source of the present invention has an anode (1) comprising multi-capillary with a bundle of capillaries, a cathode (3) for emitting thermal electrons to ionize atoms or molecules led in a uniform direction through the multi-capillary, a reflector (5) for effectively utilizing the thermal electrons by preventing the diffusion thereof, and as additional elements which are provided when required, a supporting electrode (7), a permanent magnet (9) and a target (11) for measuring the ion current. The intensity of magnetic field is between 0 to 500 gauss. The space between the cathode (3) and the anode (1) or supporting electrode (7) corresponds to an ion-generating chamber for efficiently extracting ions by suppressing the plasma generated therein from diffusing. The ion current density is elevated by installing the supporting electrode (7).

Though not specifically limited, the multi-capillary is generally composed of a bundle of about 50 to about 1000 capillaries about 0.01 to about 1.0 mm in inside diameter. The material thereof is not also specifically limited, and metals, polymers and glass are generally used.

Since the atomic or molecular flow uniformly passing in a direction efficiently comes into collision with the thermal electrons in the apparatus of the present invention shown in FIG. 1, an ion current density as high as 1.0 mA/cm$^2$ can be obtained under the optimum operating conditions using the supporting electrode (7) without applying an accelerating voltage, and a value as high as 6 mA/cm$^2$ or higher can be obtained at an accelerating voltage of 200 V.

Figure 2:
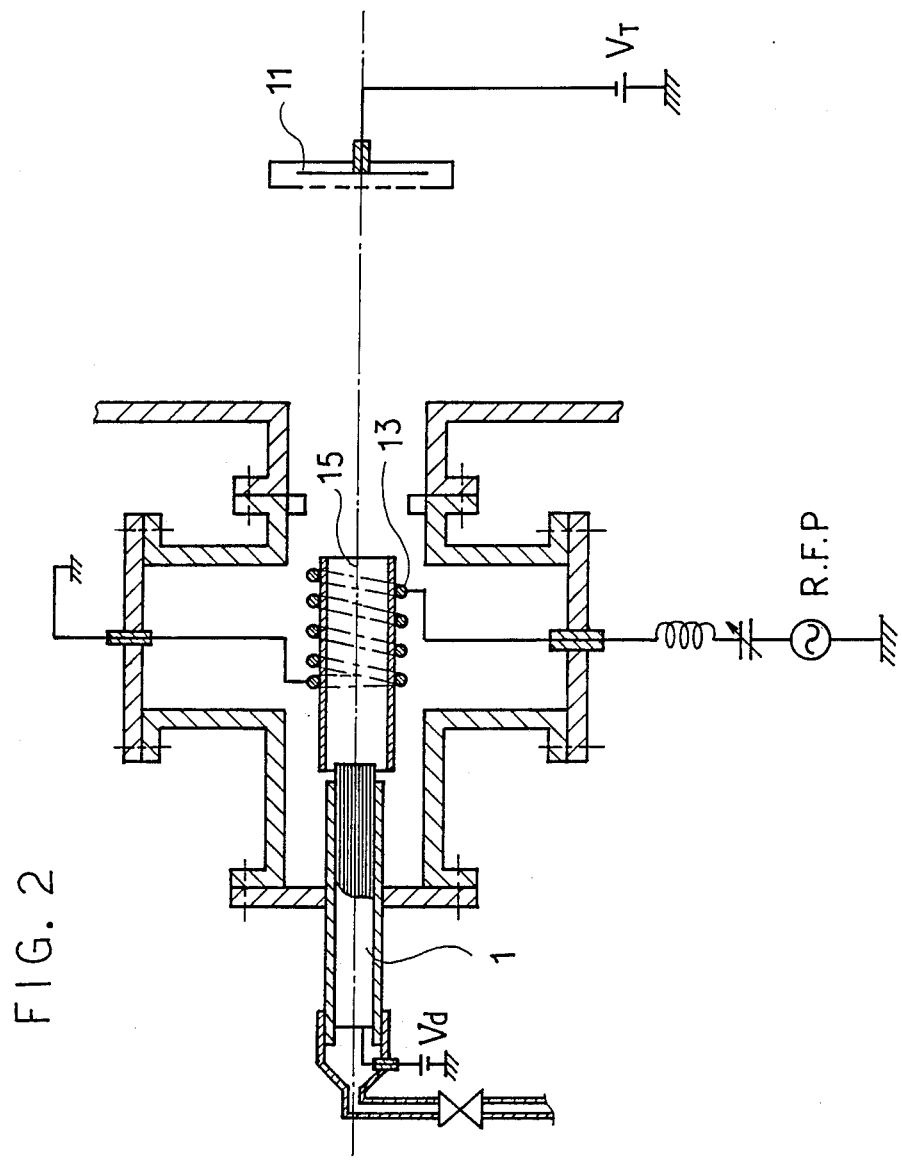
FIG. 2 is a schematic diagram of an ion source in accordance with an alternative embodiment of the invention.

FIG. 2 shows an ion source provided with an ion-generating chamber (15) made of quartz tube and the like around which a coil electrode (13) for the input of radiofrequency power is provided to efficiently ionize atoms or molecules sent in a direction through the anode (1) consisting of multi-capillary. The other components in FIG. 2 are essentially the same as those in FIG. 1.

In the apparatus of the present invention shown in FIG. 2, an ion current as high as 10 mA can be obtained even without applying accelerating voltage and an extremely high ion current of 25 mA or more can be obtained at an accelerating voltage of 200 V.

When the coil electrode (13) for the input of radiofrequency power is replaced by a waveguide for the input of microwave power in the apparatus as shown in FIG. 2, similar effects can be obtained.

Since atoms or molecules to be ionized are supplied through the multi-capillary used as the anode in the apparatus of the present invention, a high-intensity atomic or molecular beam uniformly passing in a direction is generated in the ion-generating chamber. An ion current density as high as 1 mA/cm$^2$ or more can be, therefore, easily attained even at an accelerating voltage as low as 200 V or less. Using conjointly a supporting electrode with an anode, an ion current density as high as 3 mA/cm$^2$ or more can be obtained even at an accelerating voltage as low as 50 V and that as high as 6 mAcm$^2$ or more can be obtained at 200 V. The apparatus of the present invention is, therefore, extremely useful for forming high-quality semiconducting and superconducting thin-films, etc.

The present invention will now be explained more in detail by referring to examples and comparison examples which are provided for purposes of illustration only and are not intended to limit the present invention.

Examples 1 through 9 are carried out by using the apparatus illustrated in FIG. 1 and Examples 10 through 15 by using the apparatus illustrated in FIG. 2.

Examples 1 through 5 and Comparative examples through 3 show the results obtained without the application of voltage to the supporting electrode and Examples 6 through 9 and Comparative example 4 show the results obtained applying voltage to the supporting electrode.

The symbols described in the examples and comparative examples represent the following meanings:

$V_d$: Discharging voltage
$I_d$: Discharging current
$P_{Ar}$: Partial pressure of argon gas
$P_{O2}$: Partial pressure of oxygen gas
$V_a$: Accelerating voltage
$i_a$: Ion current density
$I_a$: Ion current
$V_s$: Voltage of supporting electrode
$I_s$: Current of supporting electrode

COMPARATIVE EXAMPLE 1

The value of $i_a$ was measured varying $V_a$ under the constant conditions of $V_d$ of 60 V, $I_d$ of 1.35 A, $V_s$ of zero and $P_{Ar}$ of $2.0 \times 10^{-4}$ Torr.

The results are as shown in Table 1.

TABLE 1

| $V_a$ (V) | $i_a$ (mA/cm²) |
|---|---|
| 0 | — |
| 50 | 0.52 |
| 100 | 0.56 |
| 150 | 0.60 |
| 200 | 0.64 |

EXAMPLE 1

The value of $i_a$ was measured varying $V_a$ under the constant conditions of $V_d$ of 70 V, $I_d$ of 1.35 A, $V_s$ of zero and $P_{Ar}$ of $2.0 \times 10^{-4}$ Torr.

The results are as shown in Table 2.

TABLE 2

| $V_a$ (V) | $i_a$ (mA/cm²) |
|---|---|
| 0 | 0.09 |
| 50 | 1.01 |
| 100 | 1.07 |
| 150 | 1.13 |
| 200 | 1.19 |

The comparison of the results of Example 1 with those of Comparative example 1 reveals that an ionic corrent density as high as 1 mA/cm² or more can be obtained even at $V_a$ as low as 50 V when $V_d$ is 70 V or over and $P_{Ar}$ is $2.0 \times 10^{-4}$ Torr or lower.

COMPARATIVE EXAMPLE 2

The value of $i_a$ was measured varying $V_a$ under the constant conditions of $V_d$ of 80 V, $I_d$ of 1.5 A, $V_s$ of zero and $P_{Ar}$ of $1.2 \times 10^{-4}$ Torr.

The results are as shown in Table 3.

TABLE 3

| $V_a$ (V) | $i_a$ (mA/cm²) |
|---|---|
| 0 | −0.68 |
| 50 | 0.23 |
| 100 | 0.32 |
| 150 | 0.33 |
| 200 | 0.35 |

EXAMPLE 2

The value of $i_a$ was measured varying $V_a$ under the constant conditions of $V_d$ of 80 V, $I_d$ of 1.5 A, $V_s$ of zero and $P_{Ar}$ of $1.7 \times 10^{-4}$ Torr.

The results are as shown in Table 4.

TABLE 4

| $V_a$ (V) | $i_a$ (mA/cm²) |
|---|---|
| 0 | 0.68 |
| 50 | 1.39 |
| 100 | 1.47 |
| 150 | 1.55 |
| 200 | 1.63 |

EXAMPLE 3

The value of $i_a$ was measured varying $V_a$ under the constant conditions of $V_d$ of 80 V, $I_d$ of 1.5 A, $V_s$ of zero and $P_{Ar}$ of $2.0 \times 10^{-4}$ Torr.

The results are as shown in Table 5.

TABLE 5

| $V_a$ (V) | $i_a$ (mA/cm²) |
|---|---|
| 0 | 0.88 |
| 50 | 1.40 |
| 100 | 1.50 |
| 150 | 1.55 |
| 200 | 1.65 |

The comparison of the results of Examples 2 and 3 with those of Comparative example 2 reveals that an ionic corrent density as high as 1.39 mA/cm² or over can be obtained even at $V_a$ as low as 50 V when $V_d$ is 80 V or over and $P_{Ar}$ is $1.7 \times 10^{-4}$ Torr or under.

COMPARATIVE EXAMPLE 3

The value of $i_a$ was measured varying $V_a$ under the constant conditions of $V_d$ of 100 V, $I_d$ of 1.5 A, $V_s$ of zero and $P_{Ar}$ of $1.2 \times 10^{-4}$ Torr.

The results are as shown in Table 6.

TABLE 6

| $V_a$ (V) | $i_a$ (mA/cm²) |
|---|---|
| 0 | −0.16 |
| 50 | 0.90 |
| 100 | 0.92 |
| 150 | 0.95 |
| 200 | 0.98 |

EXAMPLE 4

The value of $i_a$ was measured varying $V_a$ under the constant conditions of $V_d$ of 100 V, $I_d$ of 1.5 A, $V_s$ of zero and $P_{Ar}$ of $1.7 \times 10^{-4}$ Torr.

The results are as shown in Table 7.

TABLE 7

| $V_a$ (V) | $i_a$ (mA/cm²) |
|---|---|
| 0 | 1.27 |
| 50 | 1.91 |
| 100 | 2.03 |
| 150 | 2.15 |
| 200 | 2.22 |

EXAMPLE 5

The value of $i_a$ was measured varying $V_a$ under the constant conditions of $V_d$ of 100 V, $I_d$ of 1.5 A, $V_s$ of zero and $P_{Ar}$ of $2.0 \times 10^{-4}$ Torr.

The results are as shown in Table 8.

TABLE 8

| $V_a$ (V) | $i_a$ (mA/cm²) |
|---|---|
| 0 | 1.25 |
| 50 | 1.80 |

TABLE 8-continued

| $V_a$ (V) | $i_a$ (mA/cm$^2$) |
|---|---|
| 100 | 1.95 |
| 150 | 2.03 |
| 200 | 2.11 |

The comparison of the results of Examples 4 and 5 with those of Comparative example 3 reveals that an ionic current density as high as 1.27 mA/cm$^2$ or over can be obtained even at zero of $V_a$, namely, without accelerating voltage, when $V_d$ is 100 V or over and $P_{Ar}$ is $1.7 \times 10^{-4}$ Torr or under and that an ionic current density as high as 2 mA/cm$^2$ or over can be obtained at $V_a$ of 200 V.

COMPARATIVE EXAMPLE 4

The value of $i_a$ was measured varying $V_a$ under the constant conditions of $V_d$ and $V_s$ of 50 V each, $I_d$ of 2.8 A, $I_s$ of 2.4 A and $P_{Ar}$ of $1.0 \times 10^{-4}$ Torr.
The results are as shown in Table 9.

TABLE 9

| $V_a$ (V) | $i_a$ (mA/cm$^2$) |
|---|---|
| 0 | −0.60 |
| 50 | 0.10 |
| 100 | 0.20 |
| 150 | 0.22 |
| 200 | 0.28 |

EXAMPLE 6

The value of $i_a$ was measured varying $V_a$ under the constant conditions of $V_d$ and $V_s$ of 50 V each, $I_d$ of 2.8 A, $I_s$ of 2.4 A and $P_{Ar}$ of $2.0 \times 10^{-4}$ Torr.
The results are as shown in Table 10.

TABLE 10

| $V_a$ (V) | $i_a$ (mA/cm$^2$) |
|---|---|
| 0 | −0.50 |
| 50 | 1.05 |
| 100 | 1.70 |
| 150 | 2.12 |
| 200 | 2.50 |

EXAMPLE 7

The value of $i_a$ was measured varying $V_a$ under the constant conditions of $V_d$ and $V_s$ of 50 V each, $I_d$ of 2.8 A, $I_s$ of 2.4 A and $P_{Ar}$ of $3.0 \times 10^{-4}$ Torr.
The results are as shown in Table 11

TABLE 11

| $V_a$ (V) | $i_a$ (mA/cm$^2$) |
|---|---|
| 0 | 0.15 |
| 50 | 2.36 |
| 100 | 3.33 |
| 150 | 4.23 |
| 200 | 4.80 |

EXAMPLE 8

The value of $i_a$ was measured varying $V_a$ under the constant conditions of $V_d$ and $V_s$ of 50 V each, $I_d$ of 2.8 A, $I_s$ of 2.4 A and $P_{Ar}$ of $4.0 \times 10^{-4}$ Torr.
The results are as shown in Table 12.

TABLE 12

| $V_a$ (V) | $i_a$ (mA/cm$^2$) |
|---|---|
| 0 | 0.80 |

TABLE 12-continued

| $V_a$ (V) | $i_a$ (mA/cm$^2$) |
|---|---|
| 50 | 3.20 |
| 100 | 4.40 |
| 150 | 5.35 |
| 200 | 6.10 |

EXAMPLE 9

The value of $i_a$ was measured varying $V_a$ under the constant conditions of $V_d$ and $V_s$ of 50 V each, $I_d$ of 2.8 A, $I_s$ of 2.4 A and $P_{Ar}$ of $5.0 \times 10^{-4}$ Torr.
The results are as shown in Table 13.

TABLE 13

| $V_a$ (V) | $i_a$ (mA/cm$^2$) |
|---|---|
| 0 | 1.00 |
| 50 | 3.17 |
| 100 | 4.30 |
| 150 | 5.10 |
| 200 | 5.50 |

The comparison of the results of Examples 6 through 9 with those of Comparative example 4 reveals that an ionic current density as high as 1.05 mA/cm$^2$ or over can be obtained even at $V_a$ as low as 50 V when a supporting electrode is conjointly used with the anode in the apparatus of the present invention and taht an ionic current density of 1.0 mA/cm$^2$ can be obtained even at $V_a$ of zero, namely without accelerating voltage under $P_{Ar}$ of $5.0 \times 10^{-4}$ Torr.

Further, an ionic current density as high as 6.1 mA/cm$^2$ which has never been attained before can be obtained under the conditions of $V_d$ of 50 V, $V_a$ of 200 V and $P_{Ar}$ of $4.0 \times 10^{-4}$ Torr.

EXAMPLE 10

The value of ionic current ($I_a$) was measured varying $V_a$ under the constant conditions of radiofrequency power (RFP) of 200 W and $P_{Ar}$ of $2.0 \times 10^{-4}$ Torr.
The results are as shown in Table 14.

TABLE 14

| $V_a$ (V) | $I_a$ (mA) |
|---|---|
| 0 | 10 |
| 50 | 11 |
| 100 | 12 |
| 150 | 12 |
| 200 | 12 |

EXAMPLE 11

The value of $I_a$ was measured varying $V_a$ under the constant conditions of RFP of 200 W and $P_{Ar}$ of $4.0 \times 10^{-4}$ Torr.
The results are as shown in Table 15.

TABLE 15

| $V_a$ (V) | $I_a$ (mA) |
|---|---|
| 0 | 20 |
| 50 | 21 |
| 100 | 22 |
| 150 | 23 |
| 200 | 24 |

EXAMPLE 12

The value of $I_a$ was measured varying $V_a$ under the constant conditions of RFP of 200 W and $P_{Ar}$ of $6.0 \times 10^{-4}$ Torr.

The results are as shown in Table 16.

TABLE 16

| $V_a$ (V) | $I_a$ (mA) |
|---|---|
| 0 | 21 |
| 50 | 22 |
| 100 | 23 |
| 150 | 24 |
| 200 | 25 |

EXAMPLE 13

The value of $I_a$ was measured varying $V_a$ under the constant conditions of RFP of 200 W and $P_{O2}$ of $2.0 \times 10^{-4}$ Torr.

The results are as shown in Table 17.

| $V_a$ (V) | $I_a$ (mA) |
|---|---|
| 0 | 9 |
| 50 | 10 |
| 100 | 11 |
| 150 | 11 |
| 200 | 11 |

EXAMPLE 14

The value of $I_a$ was measured varying $V_a$ under the constant conditions of RFP of 200 W and $P_{O2}$ of $4.0 \times 10^{-4}$ Torr.

The results are as shown in Table 18.

TABLE 18

| $V_a$ (V) | $I_a$ (mA) |
|---|---|
| 0 | 15 |
| 50 | 22 |
| 100 | 26 |
| 150 | 34 |
| 200 | 39 |

EXAMPLE 15

The value of $I_a$ was measured varying $V_a$ under the constant conditions of RFP of 200 W and $P_{O2}$ of $6.0 \times 10^{-4}$ Torr.

The results are as shown in Table 19.

TABLE 19

| $V_a$ (V) | $I_a$ (mA) |
|---|---|
| 0 | 20 |
| 50 | 38 |
| 100 | 33 |
| 150 | 39 |
| 200 | 44 |

The results of Example 10 through 12 reveal that an ionic current as high as 10 mA can be obtained under a partial pressure of argon gas of $2 \times 10^{-4}$ Torr or less in an ion source using multi-capillary combined with radiofrequency power and that an ionic current as high as 25 mA can be obtained at $V_a$ of 200 V under $P_{Ar}$ of $6 \times 10^{-4}$ Torr.

The results of Examples 13 through 15 reveal that an ionic current of 9 mA can be obtained even at Va of zero under a partial pressure of oxygen of $2 \times 10^{-4}$ Torr or less in an ion source using multi-capillary combined with radiofrequency power and that an ionic current is remarkably high as 44 mA which has never been obtained before can be achieved at $V_a$ of 200 V under $P_{O2}$ of $6 \times 10^{-4}$ Torr.

We claim:

1. Ion source comprising an ion-generating chamber and an anode formed of multi-capillary for sending high-density atoms or molecules to be ionized into the ion-generating chamber in a constant direction.

2. The ion source as claimed in claim 1, wherein the ion-generating chamber is provided with a cathode supplying thermal electrons to ionize atoms or molecules.

3. The ion source as claimed in claim 1, which is provided with a supporting electrode to increase the ion-extracting efficiency under vacuum.

4. The ion source as claimed in claim 1, which is provided with an electrode for the input of radiofrequency power or a waveguide for the input of microwave power to ionize atoms or molecules in the ion-generating chamber.

* * * * *